US006617978B2

(12) United States Patent
Ridenour et al.

(10) Patent No.: US 6,617,978 B2
(45) Date of Patent: *Sep. 9, 2003

(54) ELECTRICITY METER

(75) Inventors: Ronald E. Ridenour, Lawrenceville, GA (US); Scott Swanson, Seneca, SC (US)

(73) Assignee: SchlumbergerSema Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/855,185

(22) Filed: May 14, 2001

(65) Prior Publication Data

US 2001/0052859 A1 Dec. 20, 2001

Related U.S. Application Data

(63) Continuation of application No. 09/172,822, filed on Oct. 15, 1998, now Pat. No. 6,232,885.

(51) Int. Cl.[7] ............................................. G08C 19/02
(52) U.S. Cl. ...................... 340/870.29; 340/870.01; 324/96; 250/231.16
(58) Field of Search ....................... 340/870.02, 870.03, 340/870.29, 870.01; 324/142; 250/231.15, 231.19, 231.16; 342/96

(56) References Cited

U.S. PATENT DOCUMENTS

| | | | |
|---|---|---|---|
| 4,034,292 A | * | 7/1977 | McClelland, III ........... 250/233 |
| 4,327,362 A | | 4/1982 | Hoss |
| 4,489,384 A | | 12/1984 | Hurley et al. |
| 4,646,084 A | | 2/1987 | Burrowes et al. |
| 4,678,907 A | | 7/1987 | Lipski et al. |
| 4,680,704 A | | 7/1987 | Konicek et al. |
| 4,757,313 A | * | 7/1988 | Matsubara et al. ......... 340/3.43 |
| 5,014,213 A | * | 5/1991 | Edwards et al. ............ 324/116 |
| 5,089,771 A | | 2/1992 | Tanquay et al. |
| 5,214,587 A | | 5/1993 | Green |
| 5,442,281 A | | 8/1995 | Frisch et al. |
| 5,506,404 A | | 4/1996 | Milan-Kamski |
| 5,767,790 A | * | 6/1998 | Jovellana ............... 340/870.02 |
| 5,874,731 A | | 2/1999 | Swanson |
| 6,232,885 B1 | * | 5/2001 | Ridenour et al. ...... 250/231.14 |

* cited by examiner

*Primary Examiner*—Timothy Edwards
*Assistant Examiner*—Albert K. Wong
(74) *Attorney, Agent, or Firm*—Dority & Manning; Leonard W. Pojunas, Jr.

(57) ABSTRACT

A meter for measuring electricity usage for a given load includes a housing and two light sources disposed in the housing and configured to output light at a predetermined frequency. Two light receivers are disposed in the housing so that a light path is defined between each light source and its respective light receiver. Each light receiver is configured to receive the light from its light source and to output a signal responsively thereto. A rotatable member is disposed in the housing in the light paths and is rotatable responsively to the electricity usage. The member has a first portion and a second portion. The first portion transmits incident light while the second portion blocks light. The first portion and the second portion are defined on the member so that the member modulates the light as it rotates. A filter circuit in communication with the light receiver is configured to receive the output signal from the light receiver and to detect therefrom modulation of the light by the rotatable member.

33 Claims, 8 Drawing Sheets

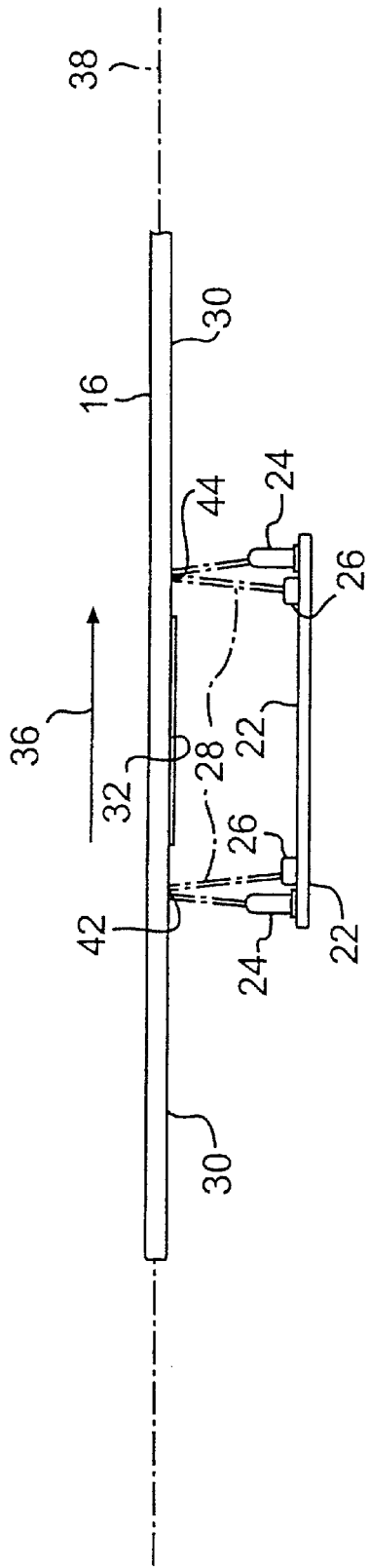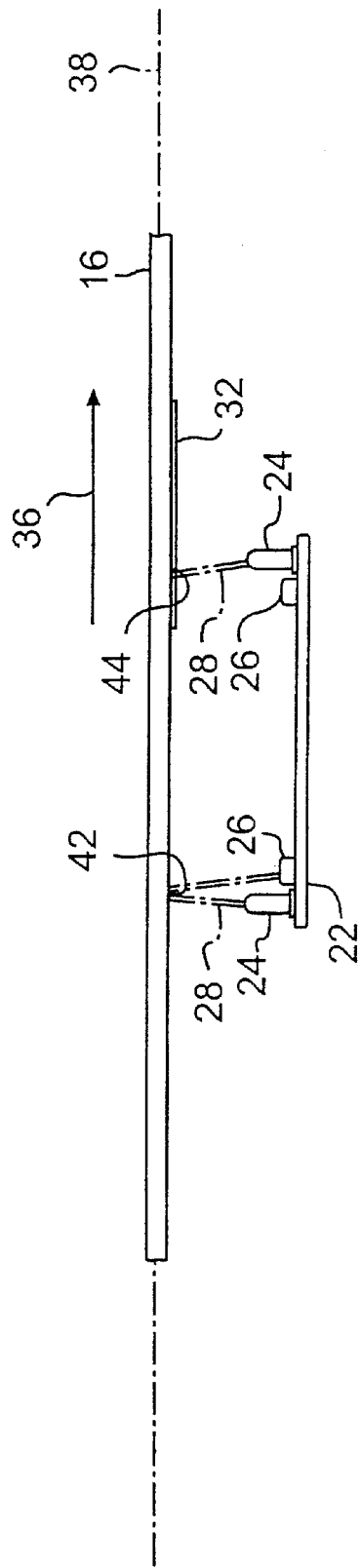

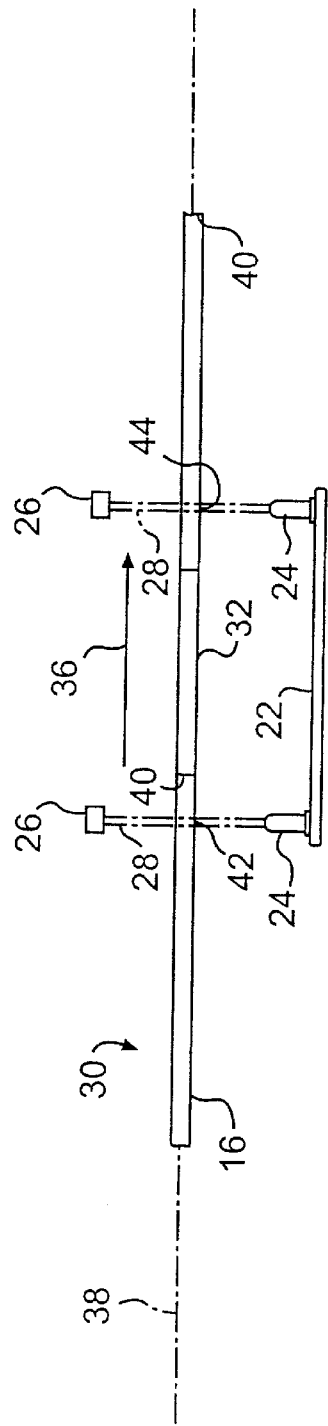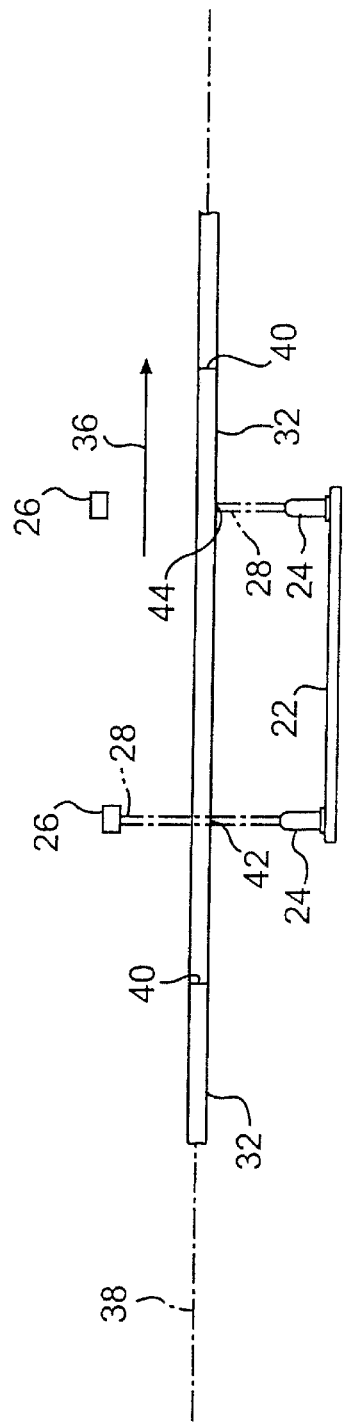

ELECTRICITY METER

This application is a continuation of U.S. application Ser. No. 09/172,822 filed Oct. 15, 1998 now U.S. Pat. No. 6,232,885.

BACKGROUND OF THE INVENTION

The present invention relates to meters for measuring usage of electricity in residential and commercial buildings. Such meters are typically referred to as "electricity meters" or "watt hour meters" and generally include an electric motor in which speed is related to power used in the building. The motor includes an armature having a disk that is partially visible through the meter's clear dome and that rotates at a speed proportional to instantaneous energy. The disk, in turn, drives gears of a numerical meter having dials that integrate instantaneous energy over time to indicate power, generally in watt hours. The difference between readings of the numerical meter at different times indicates electric power consumption during the intervening period.

Conventional electricity meters are read manually and, therefore, require that the electric utility send a field operator to periodically check every meter in the area it serves.

SUMMARY OF THE INVENTION

The present invention recognizes and addresses the foregoing disadvantages, and others, of prior art construction and methods.

Accordingly, it is an object of the present invention to provide an improved meter for measuring electric power consumption.

It is a further object of the present invention to provide an electricity meter that electronically derives data related to electricity usage.

Some of these objects are achieved by a meter for measuring electricity usage for a given load area. The meter includes a housing, a first light source and a second light source. Each light source is disposed in the housing and is configured to output light at a predetermined frequency. A first light receiver and a second light receiver are disposed in the housing so that a first light path is defined between the first light source and the second light source and so that a second light path is defined between the second light source and the second light receiver. Each light receiver is configured to receive the light from its respective light source and to output a signal responsively thereto at a frequency related to the predetermined frequency by a predetermined relationship. A rotatable member is disposed on the housing and is rotatable responsively to the electricity usage. The rotatable member defines a first portion and a second portion so that the first portion and the second portion alternatingly intercept each of the first light path and the second light path as the rotatable member rotates. The first portion transmits incident light from a light source to its respective light receiver. The second portion blocks incident light. One of the first portion and the second portion is defined on the rotatable member so that it intercepts only one of the first light path and the second light path at a time.

A filter circuit includes two bandpass filters. Each bandpass filter is in communication with a respective one of the first light receiver and the second light receiver and receives the output signal therefrom. The bandpass filter passes a frequency range that includes the related frequency so that the bandpass filter outputs a signal at the related frequency upon receipt of its light receiver's output signal.

The filter circuit includes two acquisition circuits, each in communication with a respective one of the bandpass filters. Each acquisition circuit receives the output signal from its respective bandpass filter and is configured to output responsively thereto a signal having a magnitude based on the magnitude of the bandpass filter output signal.

The filter further includes two comparator circuits, each in communication with a respective one of the acquisition circuits. Each comparator circuit receives the output signal from its respective acquisition circuit and is configured to compare the acquisition circuit output signal with a threshold voltage and output a signal in one of two states depending on the comparison.

The accompanying drawings, which are incorporated in and constitute a part of this specification, illustrate one or more embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended drawings, in which:

FIG. 3A is a partial schematic plan view taken along the line 3—3 in FIG. 2;

FIG. 3B is a partial schematic plan view taken along the line 3—3 in FIG. 2 where the meter disk has rotated about its axis;

FIG. 6A is a partial schematic plan view of an electricity meter in accordance with an embodiment of the present invention;

FIG. 6B is a partial schematic plan view of the meter as in FIG. 6A where the meter disk has rotated about its axis; and FIG. 6C is a partial schematic perspective view of a meter disk as in FIG. 6a.

Figure 1:
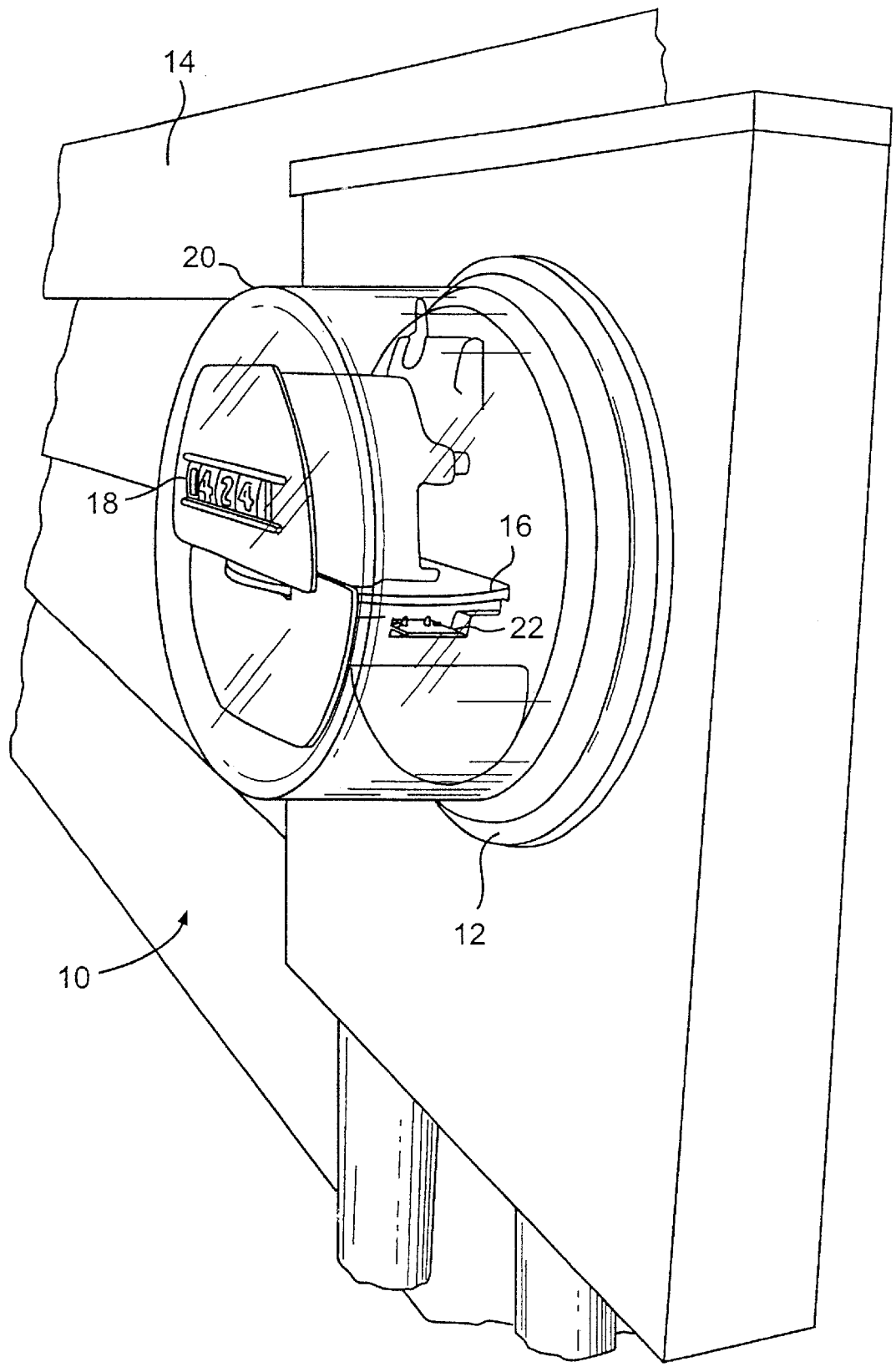
FIG. 1 is a perspective view of an embodiment of an electricity meter according to the present invention.

Repeat use of reference characters in the present specification and drawings is intended to represent same or analogous features or elements of the invention.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance features illustrated or described as part of one embodiment may be used on another embodiment to yield a still further embodiment. Thus, it is intended that the present invention covers such modifications and variations as come within the scope of the appended claims and their equivalents.

Referring to FIG. 1, an electricity meter 10 measures electricity usage in a given load area, for example a residential or commercial building 14. A meter disk 16 disposed within a housing 12 rotates at a rate proportional to the instantaneous energy used. Disk 16, in turn, drives a gearing mechanism (not shown) to drive a numerical register 18 that integrates instantaneous energy to indicate power consumption. Housing 12 includes a transparent glass or plastic dome 20 so that an operator may read numerical register 18 without dissassembling the meter housing. In this respect, the construction and operation of meter 10 is the same as that of conventional elecricity meters, which should be well understood by those skilled in this art and that are therefore not discussed in greater detail herein. An example of such a meter is a J5 watt hour meter, available from Schlumberger Industries, Inc. of Norcross, Ga.

Figure 2:
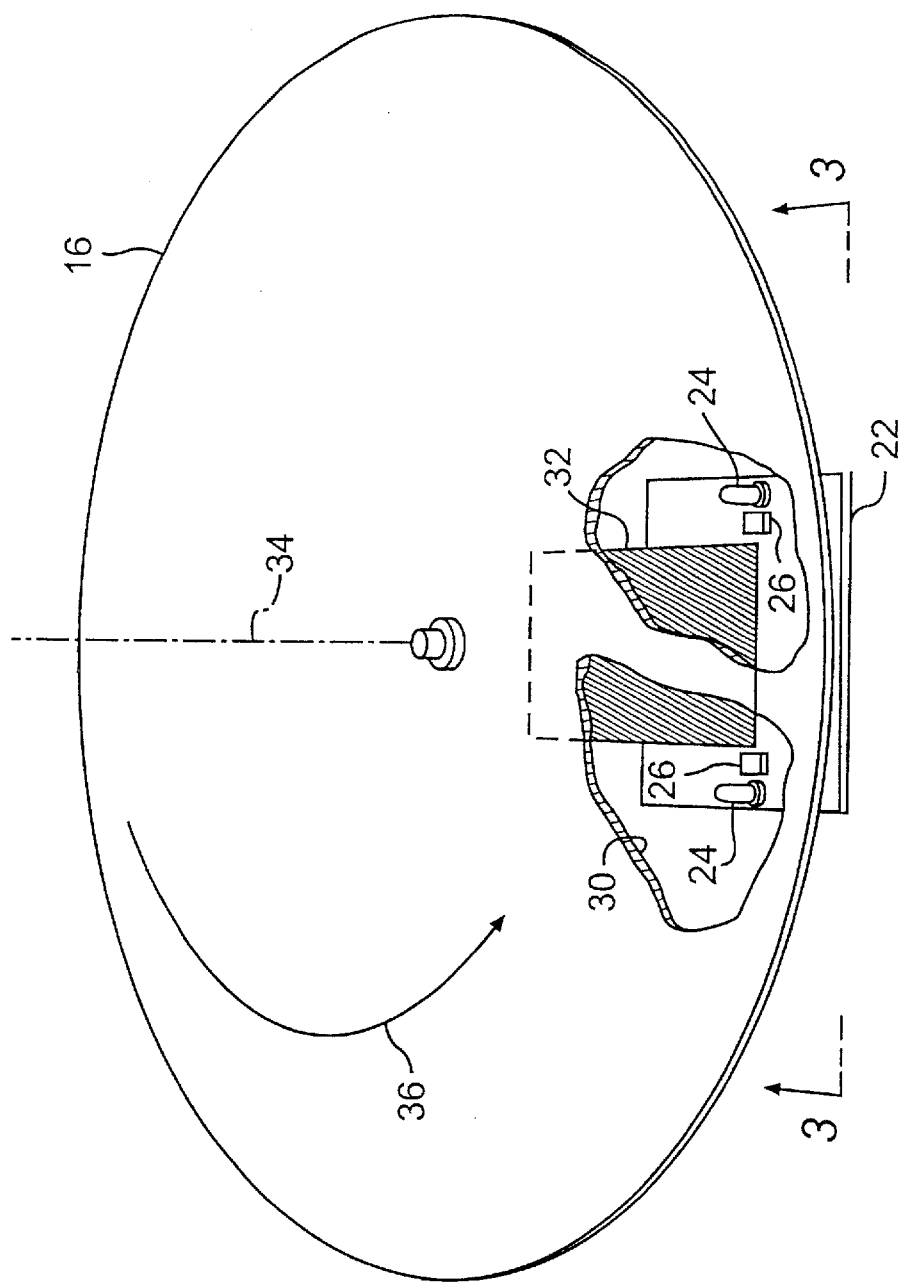
FIG. 2 is a partial schematic illustration of the meter as in FIG. 1.

Referring also to FIG. 2, a circuit board 22 is retrofit into an existing meter 10 and includes two sets of infrared light emitting diodes 24 and respective phototransistors 26. Referring to FIGS. 2 and 3A, each diode 24 emmits infrared light that is intercepted by disk 16 so that, when a reflective part of disk 16 intercepts light 28, the disk reflects the light to the respective phototransistors 26, thereby defining a light path for light 28 between each diode 24 and its phototransistor.

Disk 16 is typically made from a reflective metal such as aluminum, and the majority of the underside of disk 16 comprises a first portion 30 that is reflective to infrared light. Thus, the light path is completed when this portion passes over each diode/phototransistor pair, and the respective phototransistors 26 detect the reflected light. A second portion represented by a darkened line at 32, however, is non-reflective to infrared light and therefore blocks light 28 as shown in FIG. 3B.

As disk 16 rotates about its axis 34 as indicated by arrow 36, second portion 32 passes over each diode 24 once per revolution. Since each revolution of disk 16 corresponds to the consumption of a known amount of electric power, each interruption in the path of light 28 corresponds to the consumption of that amount of power. Accordingly, the modulation of light 28 by disk 16 is measurably related to the use of electricity in building 14 (FIG. 1). Although the "meter" disk (i.e. the disk that drives the meter) is used to modulate light in the illustrated embodiments, it should be understood that meters may include auxiliary disks, such as shutter disks, that rotate responsively to power consumption and that may be used to modulate light. Moreover, any suitable member within the meter that so rotates may be used. Thus, the references herein to the meter disk should be understood to be for exemplary purposes only.

In the embodiment shown in FIG. 2, second portion 32 may be an infrared light-absorbing strip attached to the bottom of disk 16. The strip may be made from any suitable material, for example carbon black paint, that absorbs infrared light and may be applied to the underside of disk 16 by deposition or by an adhesive. Second portion 32 could also be a hole passing through the disk. Whether a light-absorbing strip or a hole, however, second section 32 blocks infrared light 28 by preventing its transmission to a photodetector 26.

Figure 6C:
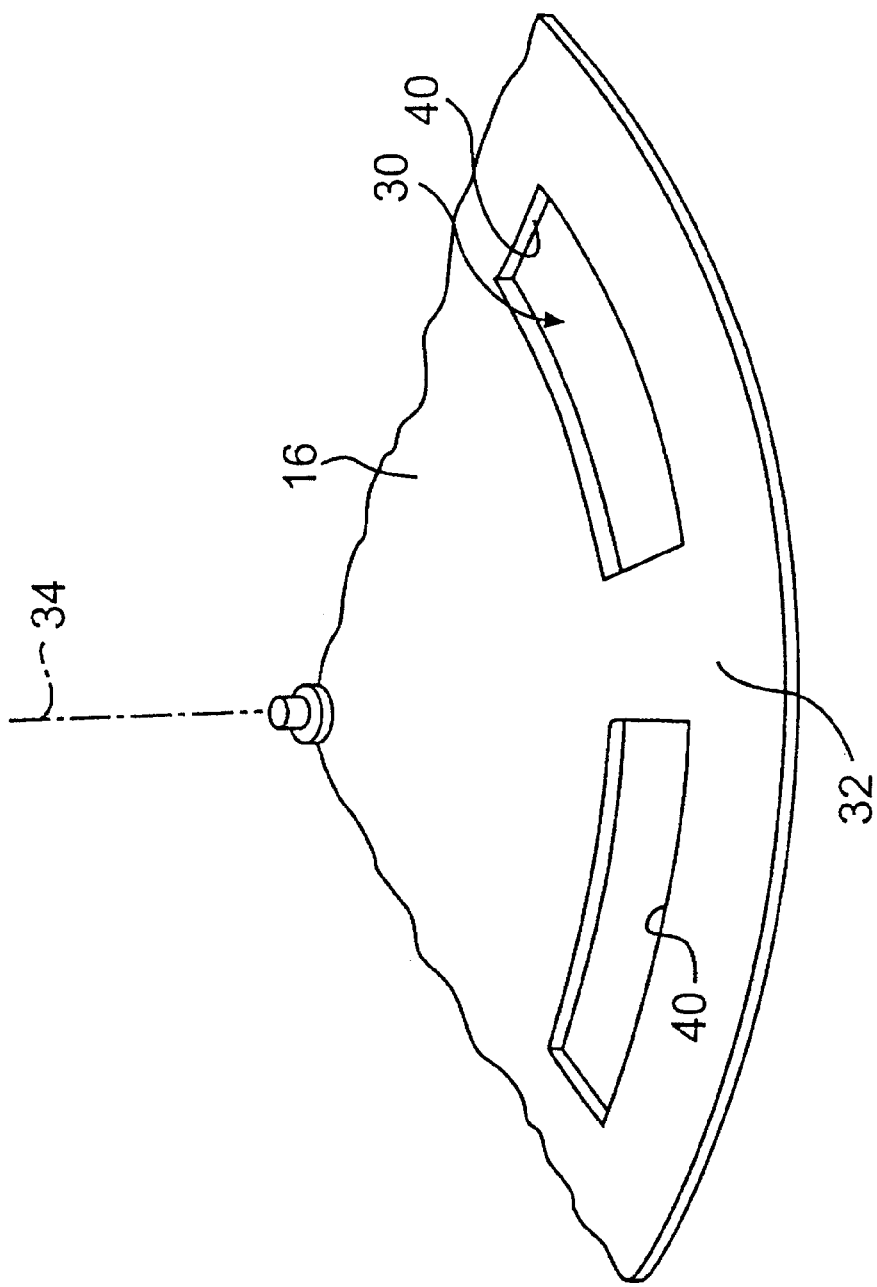

As shown in FIGS. 2, 3A and 3B, diodes 24 and phototransistors 26 are disposed on the same side of a plane 38 that includes disk 16. It should be understood, however, that other arrangements are possible. Referring to FIGS. 6A, 6B and 6C, for example, first portion 30 of disk 16 is comprised of a series of equiangularly spaced slots 40 extending axially through disk 16. Second portion 32 is comprised of solid sections between the slots. Each diode 24 and its respective phototransistor 26 are disposed on opposite sides of plane 38 so that when disk 16 is rotationally positioned about its axis 34 so that a slot 40 is between a diode 24 and its phototransistor 26, light 28 passes from the diode to the phototransistor, as shown in FIG. 6A. As disk 16 continues to rotate in the direction of arrow 36, each solid section in turn blocks light 28, as shown in FIG. 6B. The solid sections may absorb or reflect the light.

In both embodiments (i.e., FIGS. 3A/3B and FIGS. 6A/6B), disk 16 intercepts the infrared light paths from the two diodes 24 at points 42 and 44, respectively. In both embodiments, the first disk portion transmits the infrared light to the photodiode, and the second portion blocks the infrared light. The primary difference between the two embodiments is the position of the diodes and the phototransistors with respect to the disk and, therefore, the mechanism by which the first and second disk portions transmit or block infrared light.

The modulation pattern is determined by the particular configuration of the first and second disk portions. For example, in the embodiment illustrated in FIG. 2, the second portion comprises only one blocking strip so that the path of light 28 is interrupted only once per revolution of disk 16. In the embodiment shown in FIG. 6C, however, the second portion comprises a plurality of equiangularly spaced solid sections which block the light path several times, for example eight, per revolution. Thus, it should be understood by those skilled in this art that any suitable disk construction may be used within the present invention as long as the mechanism monitoring the modulated signal is able to detect the pattern.

Two diode/phototransistor pairs are used to detect the modulated light signal in the illustrated embodiments to provide redundancy and an error-check. Referring, for example, to the schematic illustration of the FIG. 2 embodiment provided in FIG. 4, non-reflective strip 32 cannot simultaneously block light from both diodes 24. Referring to the embodiment shown in FIGS. 6A–6C, the solid sections are dimensioned and spaced from each other so that only one light path can be intercepted at a time. Accordingly, detection of the second section over both diodes indicates an error.

Figure 4:
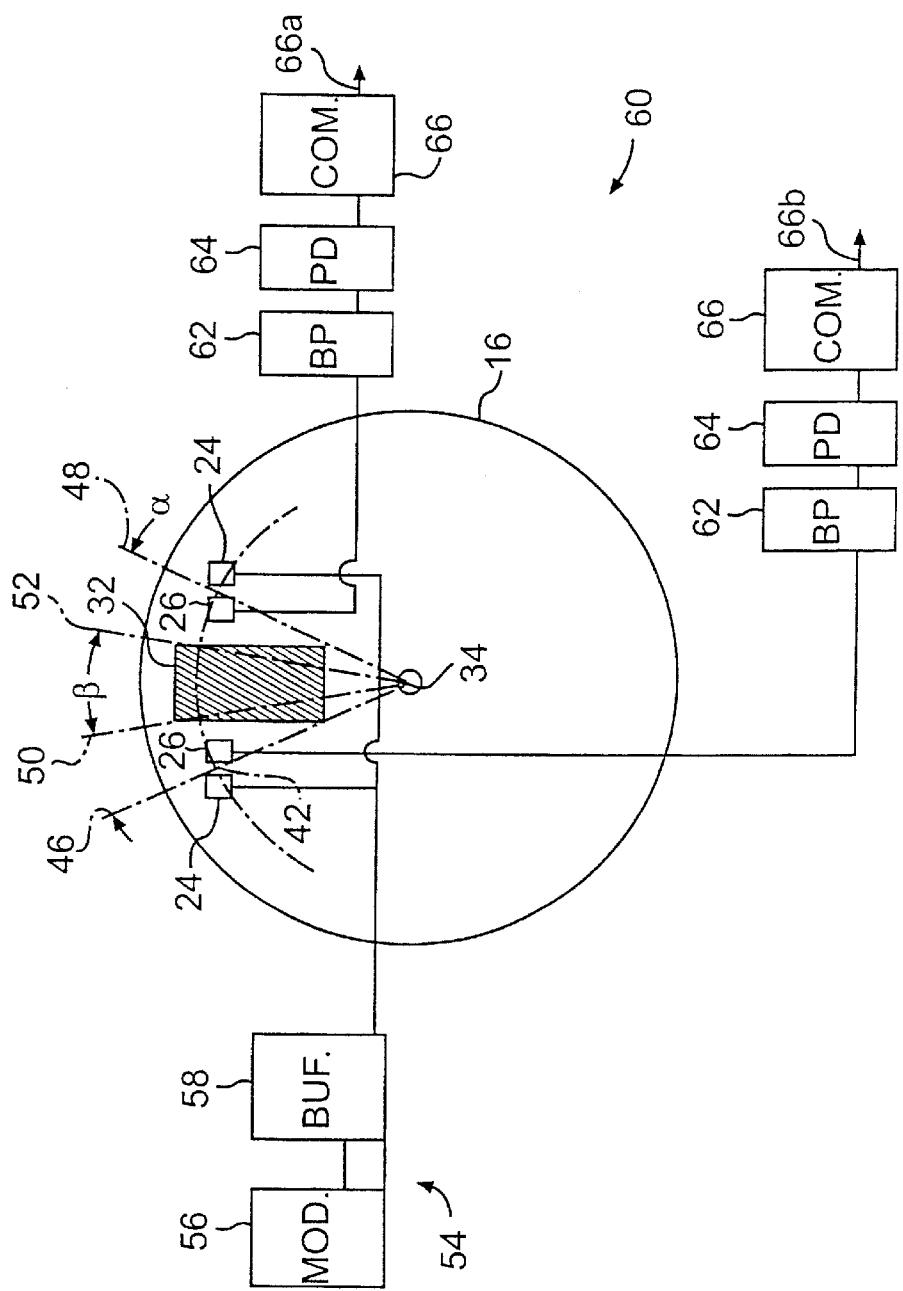
FIG. 4 is a partial schematic illustration of the meter as in FIG. 1.

More specifically, referring again to the embodiment as shown in FIG. 4, points 42 and 44 are located on the same arc 46 centered about axis 34, although it should be understood that these points may lie along different concentric arcs. The angular distance between the points is the angle $\alpha$ between a radius 46 and a radius 48 extending from axis 34 and including points 42 and 44, respectively. A radius 50 and a radius 52 extending from axis 34 include the points on the leading and following edges, respectively, of infrared absorbing strip 32 that lie on arc 46. The angular width of strip 32 along arc 46 is, therefore, equal to the angle $\beta$ between radius 50 and radius 52. Since $\beta$ is less than $\alpha$, strip 32 can be at only one of points 42 and 44 at any time. Thus, an error is indicated if both phototransistors 24 simultaneously indicate the presence of strip 32 at points 42 and 44. In the embodiment described with respect to FIGS. 2 and 4, angle $\beta$ is preferably greater than approximately 20° and, in one preferred embodiment, is approximately 24°.

Referring now to the electrical components indicated in FIG. 4, both diodes 24 are driven by a drive circuit 54, including a modulator 56 and a buffer 58, so that each diode 24 outputs infrared light at approximately 8 KHz. The phototransistors are monitored by a filter circuit 60 that includes similar circuits independently monitoring each phototransistor. Each circuit includes a bandpass filter 62, an acquisition circuit 64 and a comparator 66. As discussed in more detail below, each bandpass filter 62 receives the output of its respective phototransistor 26 and passes signals within a ±200 Hz frequency range approximately centered at the output frequency of diode 24, for example approximately 8 KHz. Acquisition 64 is a peak detector that receives the output of bandpass filter 62 and maintains an output voltage as long as an AC signal having sufficient magnitude is received from the bandpass filter. The level of the peak detector's output depends upon the AC signal's magnitude. Comparator circuit 66 compares the output from peak detector 64 against a predetermined threshold voltage and outputs a signal in one of two states depending on the result.

In short, bandpass filter 62 passes the 8 KHz signal received from its phototransistor 26 as a result of reception of the 8 KHz infrared signal. Upon receipt of the bandpass filter's signal, peak detector 64 maintains an output voltage, and comparator circuit 66 outputs a signal in one of two states, depending upon the output voltage magnitude. Since this output voltage magnitude changes across the comparator's threshold voltage at each change between a non-reflecting and reflecting disk portion, the output of comparator 66 changes state whenever such a change occurs at the corresponding point 42 or 44.

Figure 4A:
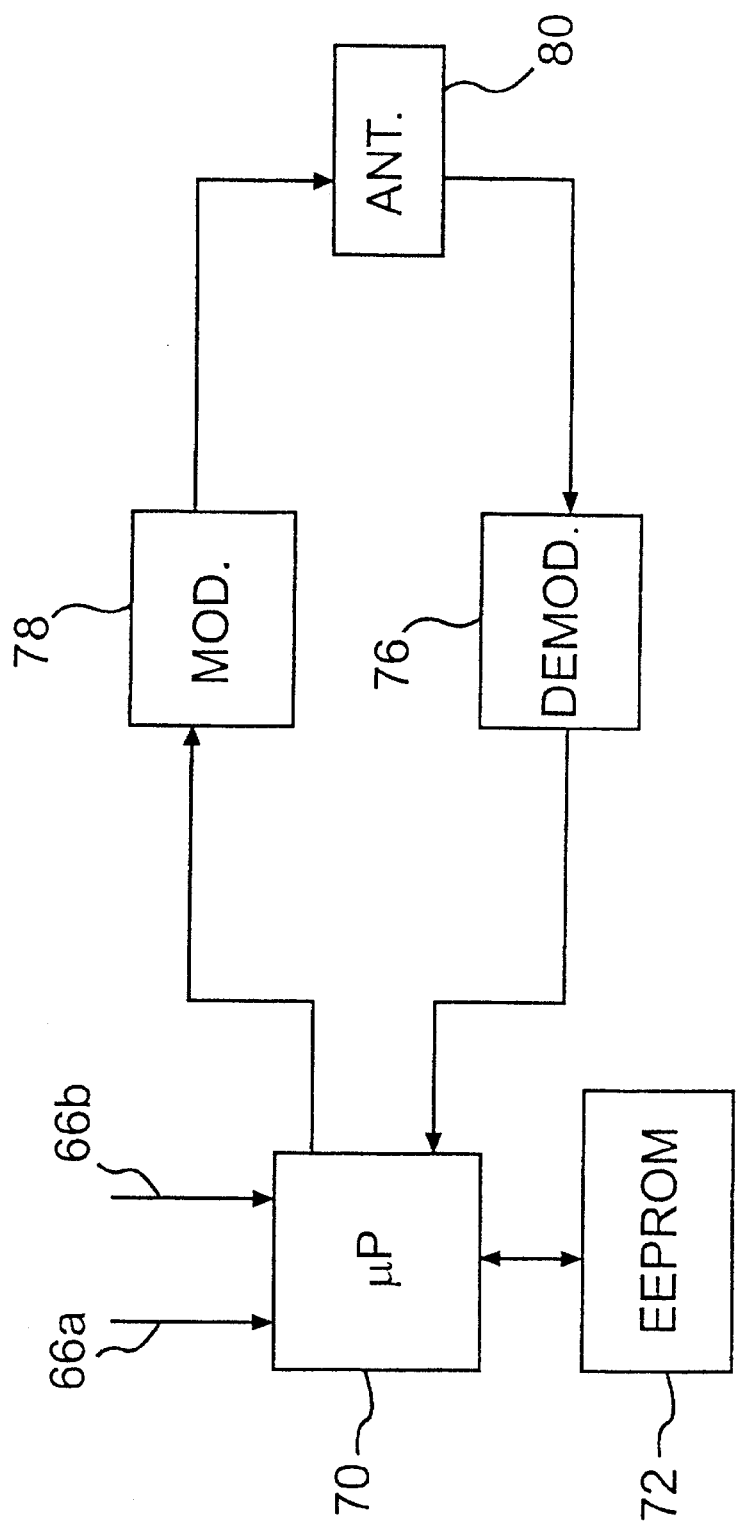
FIG. 4A is a schematic illustration of an exemplary communications mechanism for use in a meter as in FIG. 4.

Each comparator 66 outputs a respective signal 68a or 68b. Referring also to FIG. 4A, a microprocessor 70 receives these signals and is programmed to correlate their state changes to the corresponding revolutions of disk 16. Each revolution in the FIG. 2 embodiment produces two state changes, although the relationship depends on the particular disk configuration in a given meter. The microprocessor 70 stores the resulting information in a suitable memory device such as an EEPROM 72.

An operator communicates with microprocessor 70 through an RF transmitter/receiver system including an antenna 74, a demodulation circuit 76, and a modulation circuit 78. Modulation circuit 78 may include, for example, an open loop or a closed loop transmitter, and demondulation circuit 76 may include a superheterodyne receiver. The construction and operation of suitable RF transmitters and receivers should be well understood by those skilled in this art and is therefore not discussed in further detail herein.

In operation, an operator transmits a request signal received by antenna 74. The signal is demodulated by demodulating circuit 76 and output to microprocessor 70. Responsive to the request, the microprocessor retrieves the information indicating the electricity usage since the last request. In this case, the information relates to electric power consumption and can simply be the number of disk rotations since the last request or since the microprocessor was activated. If the latter, the rotation number can then be compared to the previous reading to determine the number of disk rotations in the intervening period. This number can then be correlated to the power consumption such revolutions represent. Alternatively, the microprocessor can make the correlation through a look-up table or counter.

Microprocessor 70 outputs this information in a data signal to modulation circuit 78, which drives antenna 74 to transmit a response signal to the operator. The components illustrated in FIG. 4A are disposed in the meter housing on a circuit board separate from circuit board 22 (FIGS. 1 and 2).

Figure 5:
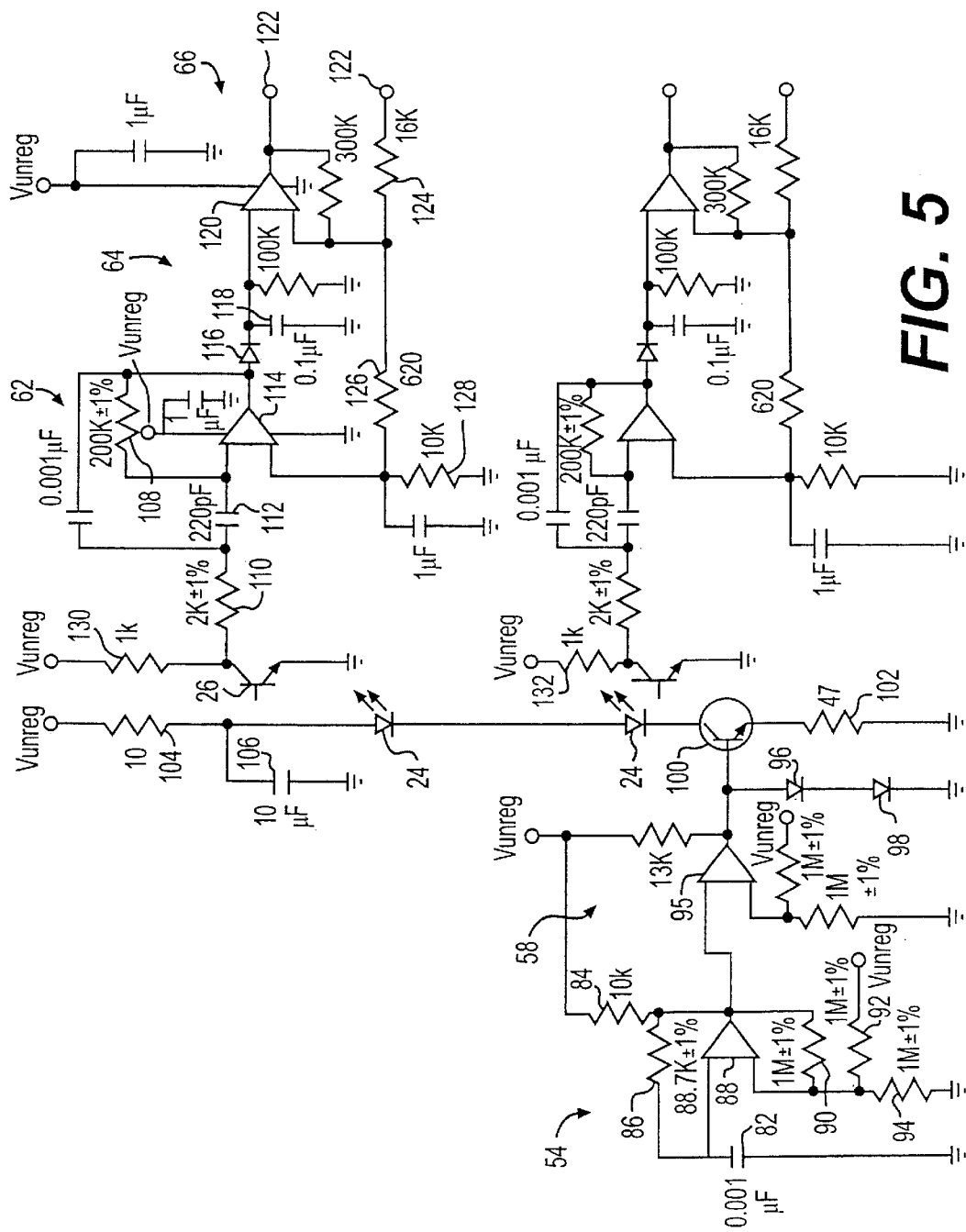
FIG. 5 is a diagrammatic illustration of the light source, light receiver and filter circuitry of the meter as in FIG. 4.

FIG. 5 provides a schematic diagram of the components shown in FIG. 4. Drive circuit 54 is, generally a square wave generator having an output frequency determined by a capacitor 82 and resistors 84 and 86. When the output of comparator 88 is high, capacitor 82 is charged by current flowing through the series combination of resistors 84 and 86. When the output of comparator 88 is low, capacitor 82 is discharged by the current flowing through resistor 86. As indicated, resistor 86 has a 1% tolerance. Unless otherwise indicated, other resistors have a tolerance of approximately 5%.

The switch points for comparator 88 are determined by resistors 90, 92 and 94. Given the values of these resistors as shown in FIG. 5, the switch point voltage is approximately $2/3$ of the unregulated power supply $V_{unreg}$ when the comparator's output is high and approximately $1/3$ of $V_{unreg}$ when the comparator's output is low. The frequency of operation is $$1.44/((R84+2R86)C82)=8041.09 \text{ Hz}.$$

Buffer 58 includes a comparator 95 that receives as its inverting input the output of comparator 88. The output of comparator 94 is voltage-limited to approximately 1.2 volts peak-to-peak by the series combination of diodes 96 and 98.

A transistor 100 controls current flow through the two infrared light-emitting diodes 24, which emit light at a wavelength of approximately 880 nm. The maximum "on" current is controlled by the transistor base voltage minus the base/emitter drop, divided by the value of resistor 102. That is, $$I_m=(Vb-Vbe)/47=(1.2-0.7)/47=10.6 \text{ mA}.$$

Resistor 104 and capacitor 106 form a low pass filter to block high frequency noise from the $V_{unreg}$ power supply.

FIG. 5 illustrates two receiver channels, each associated with a respective one of the transistors 24. Because the receiver channels are identical, however, only one is discussed in detail herein. It should be understood, however, that the construction and operation of both channels is the same.

Each phototransistor 26 includes a daylight filter (not shown) tuned to pass light in the 880 nm range. As should be well understood in this art, phototransistors are commercially available with, for example, epoxy filters that pass light only within a predetermined wavelength range. Here, phototransistors 26 detect only infrared light.

Light 28 from diode 24 incident on phototransistor 26 creates current flow that creates a voltage change at the phototransistor's collector. The collector output is, in turn, directed to the input of multiple feedback bandpass filter 62. The ratio of resistor 108 to resistor 110 determines the filter's "Q." That is, $$Q=[(R108/R110)/4]^{1/2}=[(909K/9.09K)/4]^{1/2}=5.$$

The filter's center frequency is $$0.159/[(2Q*R110)C112]=0.159/[(10*9.09K)220p)=7950.8 \text{ Hz}.$$

Its voltage gain at resonance is $2*Q^2=50$.

While most light from ambient sources such as daylight and light bulbs is filtered by the phototransistor's daylight filter, such sources may also include infrared light. Ambient infrared light, however, is typically outside the pass band of filter 62. Accordingly, the signal output by op-amp 114 should correspond to the presence or absence of light 28 incident on phototransistor 26. That is, when the phototransistor receives light 28, the signal output by the op-amp has an AC component with a frequency approximately that of light 28. When the phototransistor does not receive light 28, the AC component is not present.

To acquire the op-amp's output signal, peak detector 64 includes a diode 116 and a capacitor 118. When the AC component described above is not present in the output of op-amp 114, capacitor 118 charges to a value 0.6 V less than the op-amp output. When the AC component is present, and has a magnitude greater than 0.6 V, capacitor 118 charges to approximately the AC component's magnitude.

Comparator circuit 64 includes a comparator 120 that receives the voltage on capacitor 118 as its inverting input. Resistors 124, 126 and 128 apply a threshold voltage to the comparator's non-inverting input. When the output of op-amp 114 does not contain the AC component resulting from reception of light 28, the capacitor voltage is less than the threshold voltage, and the output 122 of comparator 120 is high. When the AC component is present, the capacitor voltage is greater than the threshold voltage, and output 122 is low. In the circuit configuration shown in FIG. 5, the threshold voltage is approximately 0.8 V above the capacitor voltage when the AC component is not present. When it is present, the capacitor voltage is approximately 0.1 V–9.2 V above the threshold voltage.

Output 122 of comparator 120 is an open collector stage and therefore requires a pull-up resistor (not shown) to power supply voltage $V_{unreg}$. The corresponding op-amp and comparator of the mirror image receiver circuit are also connected to $V_{unreg}$ and the pull-up resistor.

Referring again to the particular embodiment illustrated in FIGS. 2 and 4, each phototransistor 26 is spaced from its respective diode 24 to prevent a direct light path from the diode to the phototransistor other than to and from the disk. The phototransistors are disposed so that points 42 and 44 are separated by a distance of approximately 0.9 inches over arc 46. The arc extends approximately 0.5 inches across non-reflective strip 32. As discussed above, this ensures that the non-reflective strip is never at points 42 and 44 at the same time.

Strip 32 should be wide enough, however, that it remains over points 42 and 44 for a period long enough, even as disk 16 rotates at its fastest speed, to allow capacitor 118 to discharge to the point where the output of comparator 120 changes state. Accordingly, in the embodiments illustrated in FIGS. 2 and 4, angle β is greater than approximately 20°.

Specifically, the maximum rate of revolution for the disk of an exemplary watt hour meter is approximately 8000 revolutions per hour. The meter is rated for 200A at a nominal 240V, possibly 120% higher. Thus, $$200*240*120\% = 57,600W. \quad 57600W \div 7.2WH/rev = 8000 \; rev/hr.$$

One revolution, therefore, takes approximately 0.45 seconds.

The circumference of arc 46 (FIG. 4) is approximately 7.54 inches. Assuming that the width of arc 46 passing through strip 32 is approximately 0.5 inches, the angular width of strip 32 at arc 46 is approximately 24°. Thus, the minimum time that the strip will be at either point 42 or 44 at this speed is approximately 0.03 seconds. Where angle β is approximately 20°, this minimum time is approximately 0.25 seconds.

As noted above, the distance along arc 46 between point 42 and point 44 is approximately 0.9 inches. Thus, the distance on arc 46 traveled by strip 32 from the moment it leaves point 42 to the moment it reaches point 44 is 0.9 inches–0.5 inches=0.4 inches. The time strip 32 takes to cover this distance is the time between the change of the first output 122 from one to zero and the change of the second output 122 from zero to one.

Given that the maximum speed of disk 16 is approximately 8000 revolutions per hour, strip 32 covers this approximately 19° arc at a minimum 0.024 seconds. Preferably, in the embodiment illustrated in FIGS. 2 and 4, this arc is at least approximately 0.25 inches long, or 12°. At 12°, strip 32 covers the arc in approximately 0.15 seconds at the disk's maximum rotational speed.

In operation, as disk 16 rotates, the output 122 (FIG. 5) corresponding to each phototransistor 26 is low (0,0) when the reflective portion 30 is at each of points 42 and 44. When strip 32 passes over one of these points, however, the respective output goes high (1). Since the strip is too narrow to cover both points at one time, a 1,1 output should not occur.

Such a condition may occur, however, if one of the phototransistors is optically saturated in the presence of a significantly bright light source. If both phototransistors are saturated, the output will be a constant 1,1. If only one is saturated, the 1,1 state intermittently repeats as the strip 32 repeatedly covers the other point. A 1,1 output may also occur where a component fails or where debris blocks one or both of the light paths.

While one or more preferred embodiments of the present invention have been described above, it should be understood that any and all equivalent realizations of the invention are included within the scope and spirit thereof. For example, the invention may be realized in any suitable electricity meter design. Moreover, the construction of the meter disk, the placement of the light sources and receivers, and the circuitry design may be suitably varied depending, for example, on the particular design criteria of a given meter. Thus, the embodiments depicted are presented by way of example only and are not intended as limitations upon the present invention, and it should be understood by those of ordinary skill in the art that the present invention is not limited to these embodiments since modifications can be made. Therefore, it is contemplated that any all such embodiments are included in the present invention as may fall within the literal or equivalent scope of the appended claims.

What is claimed is:

1. A meter for measuring electricity usage for a given load, said meter comprising:
    a housing;
    a first light source and a second light source, each of said light sources being disposed in said housing and configured to output light therefrom;
    a first light receiver and a second light receiver, each of said light receivers being disposed in said housing, such that a first light path is defined between said first light source and said first light receiver and a second light path is defined between said second light source and said second light receiver, and wherein each of said light receivers is configured to receive light from its respective said light source and to output a signal responsively thereto; and
    a rotatable member disposed in said housing and being rotatable responsively to said electricity usage, said rotatable member being disposed so as to intercept each of said first light path and said second light path as said rotatable member rotates.

2. The meter as in claim 1, wherein said rotatable member defines a first portion and a second portion so that said first portion and said second portion alternatingly intercept each of said first light path and said second light path as said rotatable member rotates.

3. The meter as in claim 2, wherein said first portion transmits incident light from a said light source to its respective said light receiver and wherein said second portion blocks said incident light, and wherein one of said first portion and said second portion is defined on said rotatable member so that said one of said first and second portions can intercept only one of said first light path and said second light path at a time.

4. The meter as in claim 3, further including filter processing means for filtering said output signals and processing same.

5. The meter as in claim 4, wherein said filter processing means further includes means for comparing said filtered and processed output signals with a predetermined value.

6. The meter as in claim 5, wherein said predetermined value comprises a threshold voltage.

7. The meter as in claim 3, further including a filter circuit having two band pass filters, each in communication with a respective one of said first light receiver and said second light receiver, wherein each said band pass filter receives said output signal from its said respective light receiver and passes a frequency range that includes the frequency of said light outputs of said first and second light sources so that said band pass filter outputs a signal at such frequency upon receipt of said light receiver output signal.

8. The meter as in claim 7, wherein said filter circuit further includes:
  two acquisition circuits, each in communication with a respective one of said band pass filters, wherein each said acquisition circuit receives said output signal from its said respective band pass filter and is configured to output responsively thereto a signal having a magnitude based on the magnitude of said band pass filter output signal, and
  two comparator circuits, each in communication with a respective one of said acquisition circuits, wherein each said comparator circuit receives said output signal from its said respective acquisition circuit and is configured to compare said acquisition circuit output signal with a threshold voltage and output a signal in one of two states depending on said comparison.

9. The meter as in claim 1, wherein said rotatable member is a disk.

10. The meter as in claim 1, wherein said first and second light sources are configured to output light therefrom at a predetermined frequency.

11. The meter as in claim 10, wherein said output signals of each of said light receivers is output at a frequency related to said predetermined frequency by a predetermined relationship.

12. The meter as in claim 11, wherein said rotatable member is disposed so as to alternatingly intercept each of said first light path and said second light path as said rotatable member rotates.

13. The meter as in claim 9, wherein said disk defines first and second slots therein.

14. The meter as in claim 13, wherein said first slot and said second slot are angularly offset from each other with respect to the axis of said disk, and wherein one of said first portion and said second portion has an angular width at a first arc defined by a radius extending from said axis to said first slot and at a second arc defined by a radius extending from said axis to said second slot less than the angular distance between said first slot and said second slot.

15. The meter as in claim 14, wherein said first arc and said second arc are the same.

16. The meter as in claim 2, wherein said first portion reflects said incident light.

17. The meter as in claim 2, wherein said first portion is transparent to said incident light.

18. The meter as in claim 2, wherein said second portion is transparent to said incident light.

19. The meter as in claim 2, wherein said second portion absorbs said incident light.

20. The meter as in claim 2, wherein said second portion reflects said incident light.

21. The meter as in claim 14, wherein said one of said first portion and said second portion defines an angular width at said first arc and at said second arc at least approximately 20°.

22. The meter as in claim 21, wherein said one of said first portion and said second portion defines an angular width at said first arc and at said second arc of approximately 24°.

23. The meter as in claim 2, wherein said rotatable member is a disk, wherein said first and second light sources and said first and second light receivers are disposed on the same side of a plane defined by said disk, and wherein said first portion reflects said incident light and said second portion is non-reflective to said incident light.

24. The meter as in claim 2, wherein said rotatable member is a disk, wherein each said light source and its respective said light receiver are disposed on opposite sides of a plane defined by said disk, wherein said first portion comprises at least one hole defined by said disk and transparent to said incident light, and wherein said second portion comprises a solid, nontransparent section of said disk.

25. The meter as in claim 1, wherein each of said first light source and said second light source includes an infrared light emitting diode and a circuit configured to drive said diode at a predetermined frequency.

26. The meter as in claim 1, wherein each said light source outputs said light having a frequency of approximately 8 kHz.

27. The meter as in claim 1, wherein each of said light receivers includes a photo-transistor.

28. A meter for measuring electricity usage for a given load, said meter comprising:
  a housing;
  a first light source and a second light source, each of said light sources being disposed in said housing and configured to output light at a predetermined frequency;
  a first light receiver and a second light receiver, each of said light receivers being disposed in said housing, such that a first light path is defined between said first light source and said first light receiver and a second light path is defined between said second light source and said second light receiver, and wherein each of said light receivers is configured to receive light from its respective said light source and to output a signal responsively thereto at a frequency related to said predetermined frequency by a predetermined relationship; and
  a rotatable member disposed in said housing and being rotatable responsively to said electricity usage, said rotatable member defining a first portion and a second portion so that said first portion and said second portion alternatingly intercept each of said first light path and said second light path as said rotatable member rotates.

29. A meter as in claim 28, wherein said first portion transmits incident light from a said light source to its respective said light receiver and wherein said second portion blocks said incident light, and wherein one of said first portion and said second portion is defined on said rotatable member so that said one of said first and second portions can intercept only one of said first light path and said second light path at a time.

30. A meter as in claim 29, further including a filter circuit, including:

two band pass filters, each in communication with a respective one of said first light receiver and said second light receiver, wherein each said band pass filter receives said output signal from its said respective light receiver and passes a frequency range that includes said related frequency so that said band pass filter outputs a signal at said related frequency upon receipt of said light receiver output signal, two acquisition circuits, each in communication with a respective one of said band pass filters, wherein each said acquisition circuit receives said output signal from its said respective band pass filter and is configured to output responsively thereto a signal having a magnitude based on the magnitude of said band pass filter output signal, and two comparator circuits, each in communication with a respective one of said acquisition circuits, wherein each said comparator circuit receives said output signal from its said respective acquisition circuit and is configured to compare said acquisition circuit output signal with a threshold voltage and output a signal in one of two states depending on said comparison.

31. A meter for measuring electricity usage for a given load, said meter comprising:

a housing;

a first light source and a second light source, each said light source disposed in said housing and configured to output light at a predetermined frequency;

a first light receiver and a second light receiver, wherein each said light receiver is disposed in said housing so that a first light path is defined between said first light source and said first light receiver and so that a second light path is defined between said second light source and said second light receiver, and wherein each said light receiver is configured to receive said light from its respective said light source and to output a signal responsively thereto at a frequency related to said predetermined frequency by a predetermined relationship;

a rotatable member disposed in said housing and being rotatable responsively to said electricity usage, said rotatable member defining a first portion and a second portion so that said first portion and said second portion alternatingly intercept each of said first light path and said second light path as said rotatable member rotates, wherein said first portion transmits incident light from said light source to its respective said light receiver and wherein said second portion blocks said incident light, and wherein one of said first portion and said second portion is defined on said rotatable member so that said one of said first and second portions can intercept only one of said first light path and said second light path at a time; and a filter circuit in communication with a respective one of said first light receiver and said second light receiver, wherein said filter circuit receives said output signal from said respective light receiver and passes a frequency range that includes said related frequency so that said filter circuit outputs a signal at said related frequency upon receipt of said light receiver output signal, an acquisition circuit in communication with said filter circuit, wherein said acquisition circuit receives said output signal from said filter circuit and is configured to output responsively thereto a signal having a magnitude based on the magnitude of said filter circuit output signal, and a comparator circuit in communication with said acquisition circuit, wherein said comparator circuit receives said output signal from said acquisition circuit and is configured to compare said acquisition circuit output signal with a threshold voltage and output a signal in one of two states depending on said comparison.

32. Meter for measuring electricity usage for a given load, said meter comprising:

a housing;

a plurality of light sources, each of said plurality of light sources disposed in said housing and configured to output light at a predetermined frequency;

a plurality of light receivers, wherein each of said plurality of light receivers is disposed in said housing so that a plurality of light paths are defined between respective ones of said plurality of light sources and said plurality of light receivers, and wherein each of said plurality of light receivers is configured to receive said light from a respective one of said plurality of light sources and to output a signal responsively thereto at a frequency related to said predetermined frequency by a predetermined relationship;

a rotatable member disposed in said housing and being rotatable responsively to said electricity usage, said rotatable member defining a plurality of first portions and a plurality of second portions so that said plurality of first portions and said plurality of second portions alternatingly intercept each of said plurality of light paths as said rotatable member rotates, wherein said plurality of first portions transmits incident light from said plurality of light sources to their respective said plurality of light receivers and wherein said plurality of second portions blocks said incident light and wherein one of said plurality of first portions and said plurality of second portions is defined on said rotatable member so that said one of said first and second portions can intercept only one of said plurality of light paths at a time; and a plurality of filter circuits in communication with respective ones of said plurality light receivers, wherein said plurality of filter circuits receive said output signals from said plurality of light receivers and pass a frequency range that includes said related frequency so that said plurality of filter circuits output a signal at said related frequency upon receipt of said plurality of light receiver output signal.

33. A meter for measuring electricity usage for a given load as in claim 32, further comprising a plurality of acquisition circuits, in communication with said plurality of filter circuits, wherein said plurality of acquisition circuits receives said output signal from said plurality of filter circuits and are configured to output responsively thereto a signal having a magnitude based on the magnitude of said plurality of filter circuits output signal, and a plurality of comparator circuits, in communication with said plurality of acquisition circuits, wherein said plurality of comparator circuits receives said output signal from said plurality of acquisition circuits and are configured to compare said plurality of acquisition circuits output signal with a threshold voltage and output a signal in one of two states depending upon said comparison.

* * * * *